United States Patent [19]

Beazley

[11] Patent Number: 4,972,139
[45] Date of Patent: Nov. 20, 1990

[54] METHOD FOR INCREASING THE RESOLUTION OF MEASUREMENTS TAKEN USING A COUNTER-TIMER

[75] Inventor: Todd M. Beazley, Aloha, Oreg.
[73] Assignee: Tektronix, Inc., Beaverton, Oreg.
[21] Appl. No.: 350,981
[22] Filed: May 12, 1989
[51] Int. Cl.$^5$ .......................................... G01R 23/02
[52] U.S. Cl. .................................. 324/78 R; 364/484
[58] Field of Search .................. 307/247.1; 328/130.1, 328/136; 377/52, 49, 44; 364/484, 486; 324/77 R, 78 R, 78 D

[56] References Cited

U.S. PATENT DOCUMENTS

| | | | |
|---|---|---|---|
| 3,917,927 | 11/1975 | Minton | 324/78 D |
| 4,423,337 | 12/1983 | Wilke | 307/247.1 |
| 4,695,791 | 9/1987 | Miller | 364/484 |
| 4,760,536 | 7/1988 | Curtis | 364/484 |

Primary Examiner—Michael J. Tokar
Assistant Examiner—Louis M. Arana
Attorney, Agent, or Firm—Peter J. Meza

[57] ABSTRACT

A method for increasing the resolution of measurements taken using a counter-timer is provided that includes the steps of selecting a magnifier value and displaying the selected magnifier value on a CRT screen, performing a trial measurement with the counter-timer set at a fixed gate time and displaying the trial measurement result, calculating a new gate time from the magnifier value and trail measurement results, displaying the new gate time, and performing a second measurement with the counter-timer set to the new gate time and displaying the second measurement result.

12 Claims, 5 Drawing Sheets

METHOD FOR INCREASING THE RESOLUTION OF MEASUREMENTS TAKEN USING A COUNTER-TIMER

BACKGROUND OF THE INVENTION

This invention relates to a method for increasing the resolution of measurements taken using a counter-timer and more particularly to a method of increased resolution that provides feedback to the user regarding the time necessary to achieve the increased resolution.

It is well known in the art that counter-timers have been used to measure properties of electrical waveforms such as period, frequency, and risetime. Such a counter-timer is taught in U.S. Pat. No. 4,423,337 to Wilke entitled "Gate Circuit for a Universal Counter". Frequently such counter-timer circuits are part of a measurement system that employs an "auto-resolution" mode that continually measures and updates properties of electrical waveforms wherein the gate time of the counter-timer is fixed. However, it is necessary to alter the gate time of the counter-timer if enhanced resolution is desired.

Prior art counter-timer measurement systems generally provided for enhanced resolution by one of two methods. In a first method the user manually set the gate time of the counter-timer. The problem with this method is that the user did not know how much gate time should be increased to achieve a desired resolution. In a second method the user specified the least significant digit to be displayed The problem with this method is that the gate time of the counter-timer was automatically changed, but the user could not easily predict how long the measurement would take.

What is desired is a method for increasing the resolution of a counter-timer that enables the user to select a specified amount of increased resolution while providing feedback regarding the length of measurements using the increased resolution.

SUMMARY OF THE INVENTION

According to the present invention, a method for increasing the resolution of measurements taken using a counter-timer is provided that includes the steps of selecting a magnifier value and displaying the selected magnifier value on a CRT screen, performing a trial measurement with the counter-timer set at a fixed gate time and displaying the trial measurement result, calculating a new gate time from the magnifier value and trial measurement results, displaying the new gate time, and performing a second measurement with the counter-timer set to the new gate time and displaying the second measurement result.

DESCRIPTION OF PREFERRED EMBODIMENT

Figure 1:
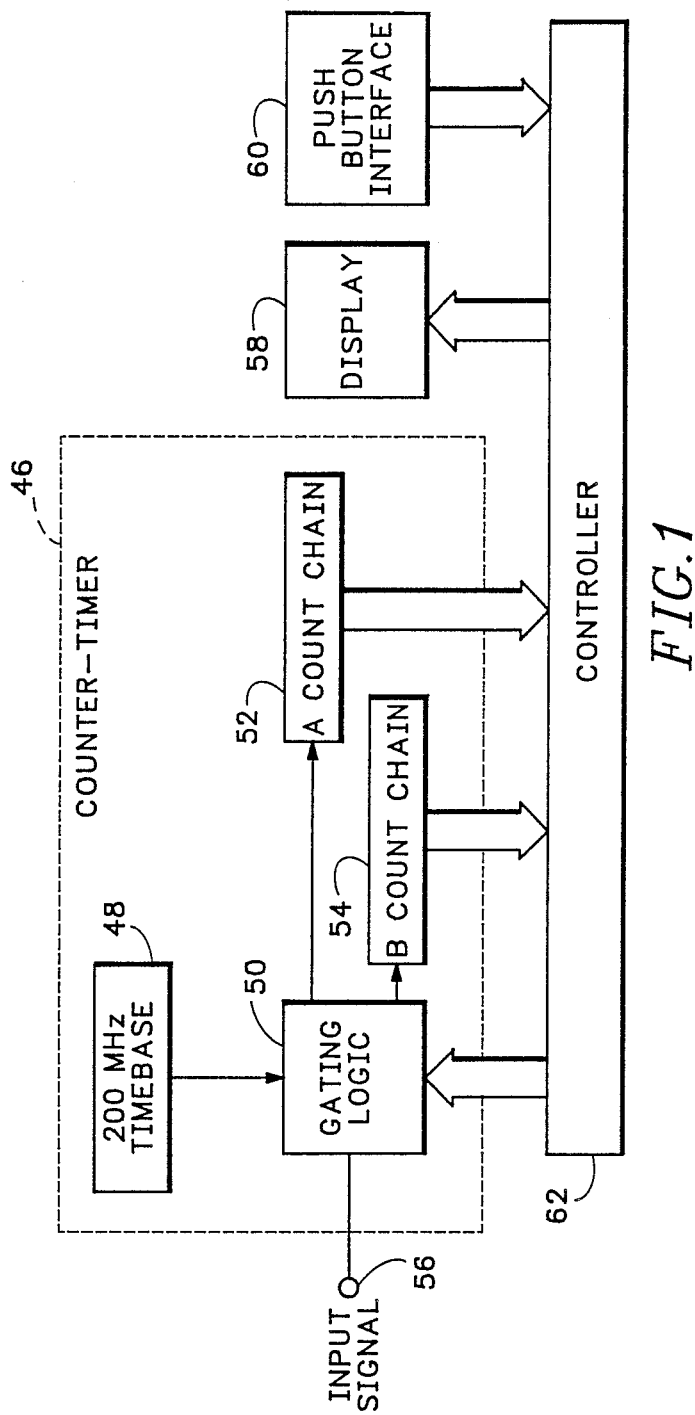
FIG. 1 is a block diagram of a measurement system incorporating a counter-timer.

Referring to FIG. 1, a block diagram of a counter-timer measurement system includes a counter-timer 46 comprising a 200 MHz timebase 48 that provides a precision timing reference signal for the counter-timer, gating logic 50 that employs the gate circuit shown in FIG. 1 of the US Patent to Wilke, and A and B count chains 52 and 54 that count the input signal and the 200 MHz timebase signal that are gated by gating logic 50. The input signal to the counter-timer 46 is received at the input terminal 6. The output from the A and B count chains 52 and 4 are read by a controller 62. The controller 62 is a microprocessor based control system that provides a gate time signal to the counter-timer 46. The controller 62 also executes the resolution magnification method according to the present invention. The controller 62 is accessed by pushbutton interface 60 and the measurement results are displayed on display means 58 that may be a cathode ray tube (CRT) capable of displaying waveform signals and alpha-numeric text. If desired the block diagram of FIG. 1 may be incorporated into an oscilloscope or other test and measurement device.

Figure 2:
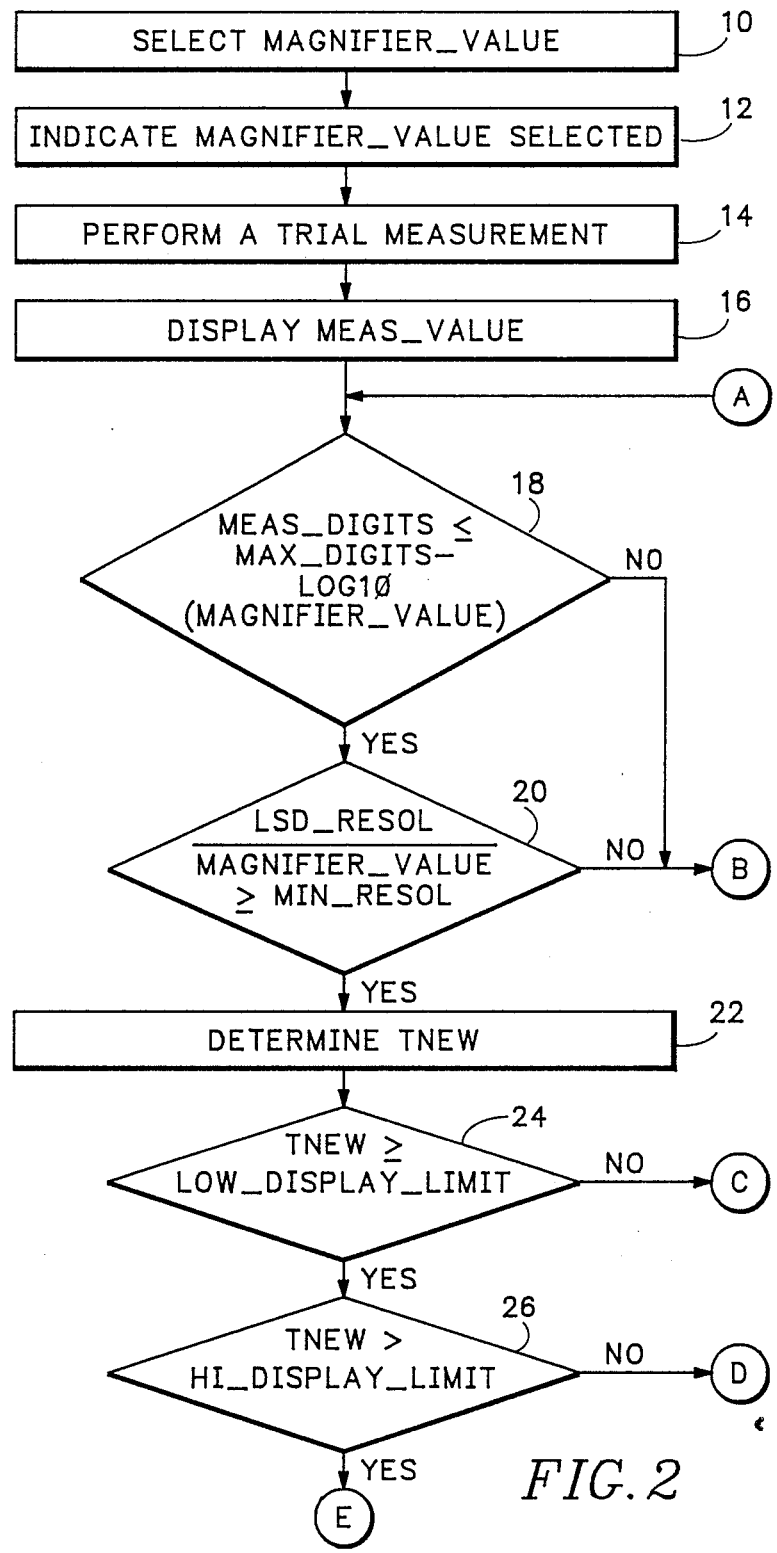
FIG. 2 is a portion of the flow chart for the method of increasing resolution according to the present invention.

The method for increasing the resolution of measurements taken using the counter-timer measurement system of FIG. 1 proceeds with selecting a MAGNIFIER_VALUE as shown in block 10 in the flow chart of FIG. 2. The MAGNIFIER_VALUE may be any value greater than one. Typically a value of ten is chosen with other values available to be selected increasing in powers of ten. After the MAGNIFIER_VALUE is chosen the value is displayed on a display means as shown in block 12. An indication of the MAGNIFIER_VALUE provides feedback to the user as to what value was selected.

Once a MAGNIFIER_VALUE is selected a trial measurement is performed as indicated in block 14. The counter-timer measurement system is usually controlled to perform one measurement in an "auto-resolution" mode wherein the gate time ("TGATE") of the counter-timer is fixed. Typically in auto-resolution modes TGATE may be set to a time less than one second. As is known in the art, the measurement results and resolution value are computed from the count chain contents of the counter-timer. By way of example a period measurement using the counter-timer taught in U.S. Pat. No. 4,423,337 to Wilke is analyzed.

The Wilke counter-timer uses an A count chain and a B count chain to compute the period of an electrical waveform. The A count chain contains the number of periods measured during measurement time TGATE, while the B count chain contains the number of time base clock pulses that occurred during TGATE. Assuming the time base clock rate is 200 MHz:

Period=(B count * 5 nanoseconds)/(A count). The resolution of the measurement ("MEAS RESOL") is dependent upon the value of A count. If A count is equal to one, the resolution is 5 nanoseconds. If A count is equal to 100 (i.e., 100 periods averaged together during the measurement), the resolution is improved by a factor of 100, or 50 picoseconds. The basic principle of the counter-timer and count chains is easily adaptable to other measurements such as frequency, time-interval, and risetime.

Once the trial measurement is completed the measurement value ("MEAS_VALUE") and MEAS_RESOL are computed. MEAS_VALUE is displayed on a display means as indicated in block 16.

The number of digits that are displayed ("MEAS_DIGITS") is derived from the MAGNITUDE as well as the resolutuon of the least significant digit ("LSD_RESOL") to be displayed. MAGNITUDE is defined as the largest power of 10 that is smaller then MEAS_VALUE. For example, if a period measurement is 8.75 microseconds the MAGNITUDE is 1 microsecond. LSD_RESOL is defined as the value of one increment of the least significant digit displayed for a counter-timer measurement, and is normally the smallest power of 10 that is greater than or equal to MEAS_RESOL. For example, if a period measurement had an associated MEAS_RESOL of 75 picoseconds, the LSD_RESOL is 100 picoseconds. Thus the number of displayed digits is given by:

$$MEAS\_DIGITS = LOG10(MAGNITUDE) - LOG10(LSD\_RESOL) + 1.$$

Under certain measurement conditions MEAS_DIGITS may exceed the maximum number of digits that the display means can accommodate ("MAX_DIGITS"). Under these conditions LSD RESOL is increased to a higher power of ten in order that MEAS DIGITS is equal to MAX DIGITS. Assuming that a period measurement produced the following results: MEAS_VALUE=2 seconds and MEAS_RESOL=2 nanoseconds. Assuming further that MAX_DIGITS has a value of 8 and LSD RESOL is initially set to 10 nanoseconds then:

$$\begin{aligned}
MEAS-DIGITS &= LOG10(1 \text{ second}) - \\
&\quad LOG10(10 \text{ nanoseconds}) + 1 \\
&= 0 - (-8) + 1 \\
&= 9
\end{aligned}$$

Since 9 is greater than MAX_DIGITS, LSD_RESOL is increased to 100 nanoseconds in order that MEAS_DIGITS is equal to MAX_DIGITS.

In decision block 18, the number of MEAS_DIGITS is tested to determine whether the number is less than or equal to a predetermined number of digits. The predetermined number of digits is:

$$MAX\_DIGITSLOG10(MAGNIFIER\_VALUE)$$

where MAX_DIGITS is a value representing the maximum number of digits that the counter-timer measurement system can display for a measurement result. Improving the resolution of a measurement necessarily adds more digits to the display. Thus the term LOG10(MAGNIFIER_VALUE) is added to the equation to insure that there is space for the added digits. For example, if a MAGNIFIER_VALUE of 100 is selected, and is valid, then two more digits are displayed (LOG10 (100)=2). Therefore, initially MEAS_DIGITS must be less than or equal to MAX_DIGITS-2 in order that the new resolution can be displayed. If the result of decision block 18 is yes, the method continues to the next decision block. If the result is no, the method proceeds to point B.

Similarly, decision block 20 tests to prevent the resolution of MEAS_VALUE from dropping below a minimum system resolution. MIN_RESOL is defined as a value that represents the smallest subdivision of the units of a measurement that the counter-timer system can resolve. Decision block 20 specifically tests whether LSD_RESOL divided by MAGNIFIER_VALUE is greater than or equal to MIN_RESOL. If the result of decision block 20 is yes, the method continues. If the result is no, the method again proceeds to point B.

Assuming that the result of both decision blocks 18 and 20 was yes a new gate time ("TNEW") is calculated in block 22. TNEW is the new counter-timer gate time that is used for the selected MAGNIFIER_VALUE. Further assuming that the results of the trial measurement are stored the new gate time is:

$$TNEW = MAGNIFIER\_VALUE*TGATE* ((MEAS\_RESOL)/(LSD\_RESOL)).$$

MEAS_RESOL is a value representing the smallest subdivision of the units of a measurement that the counter-timer can resolve, and is a relative quantity that varies as the signal being measured varies. In contradistinction, MIN_RESOL is a predetermined constant that specifies the smallest resolution that can be displayed for a particular type of measurement. MIN_RESOL is determined by the limits of the measurement apparatus or display means used.

As the previous example of a period measurement demonstrated, measurement resolution improves as gate time is increased However, the displayed resolution is LSD_RESOL, which is typically larger than MEAS_RESOL. Therefore the above equation accounts for this difference and only increases TNEW by the minimum amount needed for the increased resolution. Thus the above formula provides the optimum value for TNEW for a desired increase in resolution.

Once TNEW has been calculated, the value of TNEW is tested in decision block 24. The value of TNEW is tested to determined whether it is greater than or equal to a predetermined minimum period of time ("LOW_DISPLAY_LIMIT"). If the result is no, the method proceeds to point C. If the result is yes, the method proceeds to the next decision block.

Similarly, the value of TNEW is tested in decision block 26. The value of TNEW is tested to determine whether it is greater than a predetermined maximum period of time ("HI_DISPLAY_LIMIT"). If the result is yes, the method proceeds to point E, if the result is no, the method proceeds to point D. Assuming the result of decision block 26 is no, the method proceeds to FIG. 3 through point D. Block shows that TNEW is now displayed on the display means and a new measurement using TNEW is performed in block 44. The preceding description shows the method flow if an increase in resolution is possible, and the increased resolution may be performed within certain time constraints.

Figure 3:
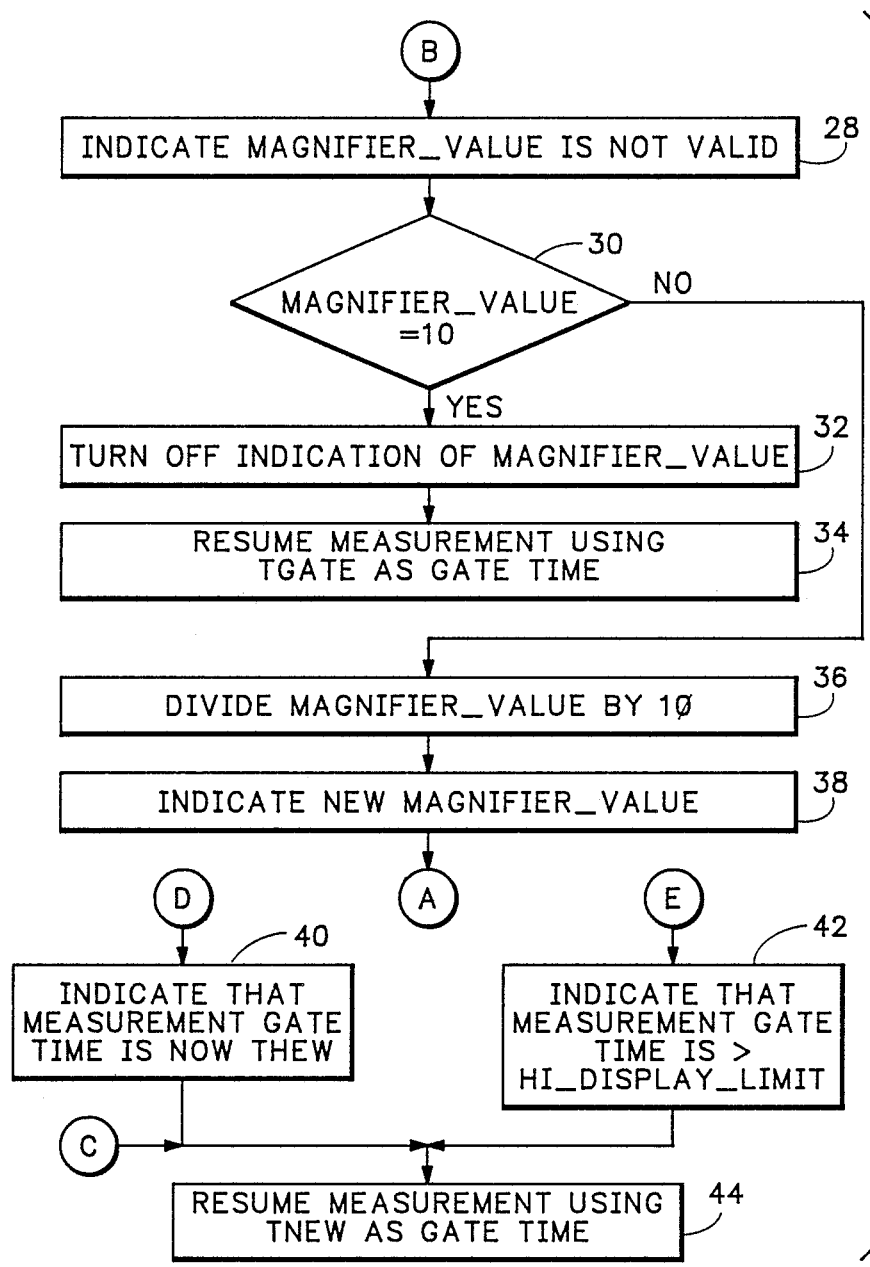
FIG. 3 is a continuation of the flow chart for the method of increasing resolution according to the present invention.

If the increase in resolution is not able to be performed, the result of decision blocks 18 or 20 is no and the method proceeds to FIG. 3 through point B. Block 28 shows that an indication that MAGNIFIER_VALUE is not valid is displayed on the display means. Assuming that magnifer values of 10 and 100 are available, decision block 30 tests whether MAGNIFIER_VALUE is equal to 10. If so, no other smaller MAGNIFIER_VALUE is available and the indication of MAGNIFIER_VALUE is turned off in block 32. The method then returns to the "auto-resolution" mode in block 34 using the previous fixed TGATE counter-timer gate time. If the result of decision block 30 is no, MAGNIFIER_‡VALUE is equal to 100. Therefore MAGNIFIER_VALUE is divided by 10 in block 36 and a new indication of MAGNIFIER_VALUE is displayed on the display means at block 38. The method is subsequently returned to FIG. 2 through point A and proceeds with the new MAGNIFIER_VALUE.

If the measurement with increased resolution may not be performed within certain time constraints the method proceeds to FIG. 3 through points C and E. If the result of decision block 24 is no, TNEW is below a predetermined lower time limit, LOW_DISPLAY_LIMIT. LOW_DISPLAY LIMIT is typically set at 5 seconds and therefore if TNEW is less than 5 seconds, an indication thereof is unnecessary. The method proceeds directly to block 44 where the measurement is performed with TNEW. If the result of decision block 26 is yes, TNEW is above a predetermined upper time limit, HI_DISPLAY_LIMIT. HI_DISPLAY_LIMIT is typically set at 9999 seconds and therefore an indication is made that the maximum upper time limit has been exceeded in block 42. The method proceeds, however, to block 44 and the new measurement is performed with TNEW unless aborted by the user.

Figure 4:
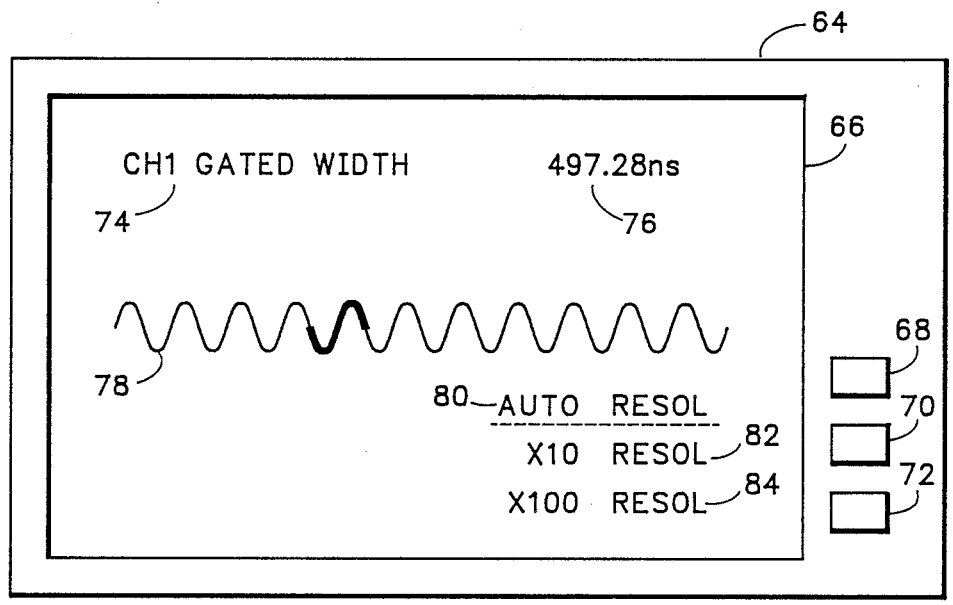
FIG. 4 is a front view of a measurement instrument showing a front panel and a CRT screen displaying an auto-resolution mode.

FIG. 4 shows a typical measurement instrument 64 having a CRT display means 66 for displaying the various measurement results and indications according to the present invention. A signal 78 is displayed having an intensified zone; the width of the signal portion within this zone is to be measured. The display menu includes an auto-resolution label 80, a times ten label 82, and a times one hundred label 84. A corresponding auto-resolution pushbutton 68, times ten pushbutton 70 and times one hundred pushbutton 72 are shown on the front panel of the measurement instrument 64. If desired, an indication that the measurement instrument is in the counter-timer measurement mode may be displayed. Such an indication is the label "CH1_GATED_WIDTH' 74. The measurement result 76 of the auto-resolution mode is also displayed. FIG. 4 shows the CRT display means 66 as it appears with the auto-resolution menu label being automatically selected and underlined upon the operator depressing auto-resolution pushbutton 68.

Figure 5:
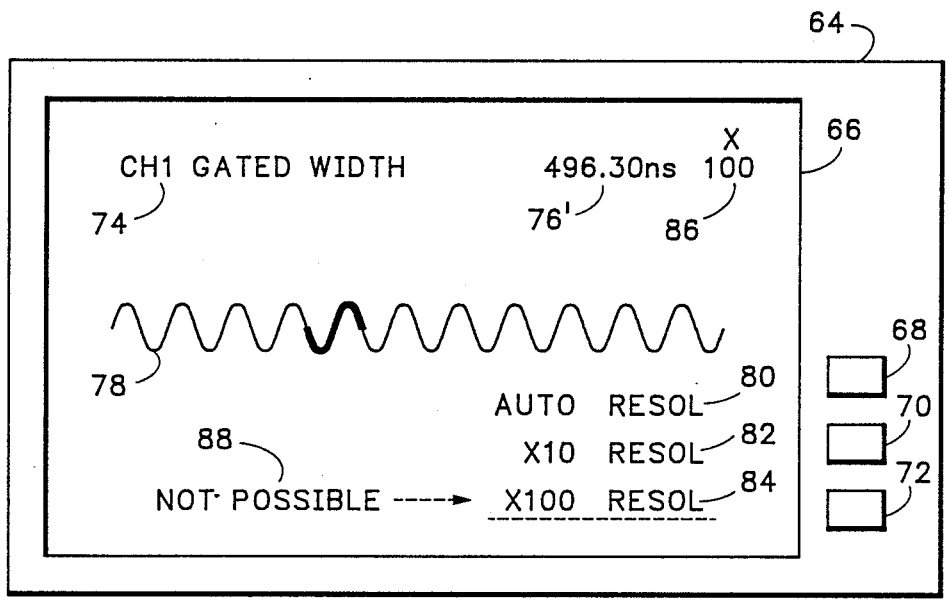
FIG. 5 is a front view of a measurement instrument showing a front panel and a CRT screen displaying a selected magnifier value and corresponding invalid magnifier value indication.

FIG. 5 shows the CRT display means 66 with the times one hundred resolution MAGNIFIER_VALUE being selected and underlined. The times one hundred label 84 is underlined indicating that the operator has depressed pushbutton 72. Adjacent to the underlined times one hundred label 84 is a "NOT POSSIBLE" indication 88 showing that the improved resolution measurement cannot be performed. A trial measurement result 76, and a times one hundred indication 86 are also displayed.

Figure 6:
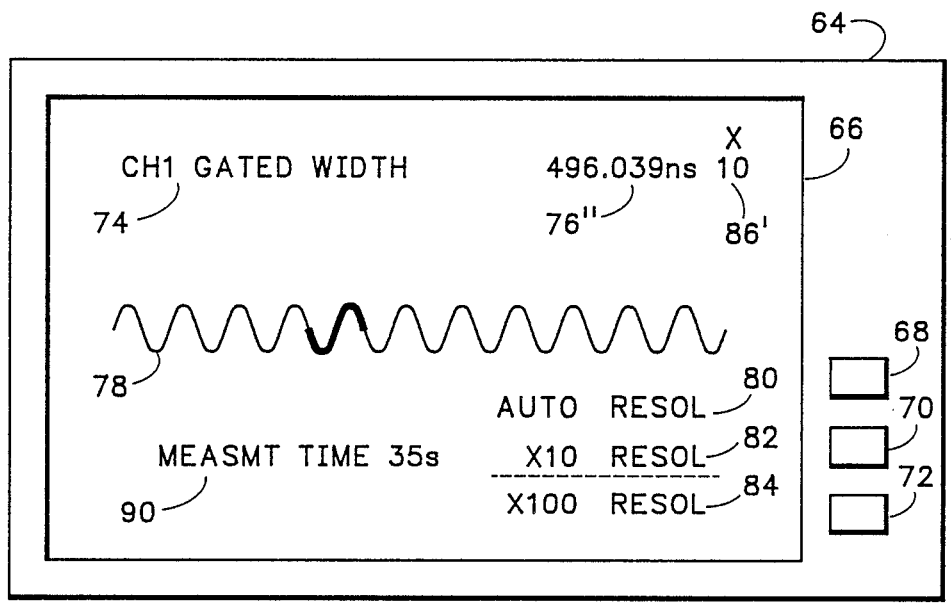
FIG. 6 is a front view of a measurement instrument showing a front panel and a CRT screen displaying a selected magnifier value and corresponding measurement time.

FIG. 6 shows the CRT display means 66 with the times ten resolution MAGNIFIER_VALUE being automatically selected and underlined. The times ten label 82 is underlined indicating that the method has automatically selected the lower magnification mode. Adjacent to the underlined times ten label 82 is a measurement time indication 90 showing the required measurement time to achieve the improved resolution. In this display, the times 10 resolution is possible and the "NOT POSSIBLE" indication has been removed. The measurement result showing the enhanced resolution 76" and a times ten indication 86, are also displayed.

While a preferred embodiment of the present invention has been shown and described, it is apparent to those skilled in the art that many changes and modifications may be made without departing from the invention in its broader aspects. The appended claims are therefore intended to cover all such changes and modifications as fall within the true spirit and scope of the invention.

I claim:

1. A method for increasing the resolution of measurements taken using a counter-timer comprising the steps of:
   selecting a magnifier value;
   displaying the selected magnifier value on a display means;
   performing a trial measurement with the counter-timer set at a predetermined gate time;
   displaying the trial measurement result on the display means;
   determining a new gate time based upon the selected magnifier value and the trial measurement result;
   displaying the new gate time on the display means;
   performing a second measurement with the counter-timer set to the new gate time; and
   displaying the second measurement result on the display means.

2. A method as in claim 1 further comprising the steps of:
   determining the number of digits in the trial measurement result and
   comparing the number of digits to a predetermined maximum number of digits.

3. A method as in claim 2 further comprising the step of displaying an invalid magnifier value indication on the display means if the number of digits in the trial measurement exceeds the predetermined maximum number of digits.

4. A method as in claim 3 further comprising the steps of:
   automatically decreasing the selected magnifier value by a predetermined amount to provide a new magnifier value; and
   restarting the method for increased resolution using the new magnifier value as the selected magnifier value.

5. A method as in claim 3 further comprising the steps of:
   automatically decreasing the selected magnifier value by a predetermined amount to provide a new magnifier value; and
   reselecting an autoresolution mode wherein the counter-timer is set to the predetermined gate time if the decreased magnifier value is less than a predetermined amount.

6. A method as in claim 1 further comprising the steps of:
   determining the resolution of the least significant digit in the trial measurement result and
   comparing the resolution of the least significant digit divided by the selected magnifier value to a predetermined minimum measurement resolution.

7. A method as in claim 6 further comprising the step of displaying an invalid magnifier value indication on the display means if the resolution of the least significant digit divided by the selected magnifier value is less than the predetermined minimum measurement resolution.

8. A method as in claim 7 further comprising the steps of:
automatically decreasing the magnifier value by a predetermined amount to provide a new magnifier value; and
restarting the method for increased resolution using the new magnifier value as the selected magnifier value.

9. A method as in claim 7 further comprising the steps of:
automatically decreasing the selected magnifier value by a predetermined amount to provide a new magnifier value; and
reselecting an autoresolution mode wherein the counter-timer is set to the predetermined gate time if the decreased magnifier value is less than a predetermined amount.

10. A method as in claim 6 wherein the step of determining the new gate time comprises:
determining the measurement resolution of the trial measurement result;
calculating the product of the selected magnifier value, the predetermined gate time, and the measurement resolution; and
dividing the product by the resolution of the least significant digit of the trial measurement result to produce the new gate time.

11. A method for increasing the resolution of measurements taken using a counter-timer comprising the steps of:
selecting a magnifier value;
displaying the selected magnifier value on a display means;
performing a trial measurement with the counter-timer set at a predetermined gate time;
displaying the trial measurement result on the display means;
determining a new gate time based upon the selected magnifier value and the trial measurement result;
comparing the new gate time to a predetermined minimum gate time;
displaying the new gate time on the display means if the new gate time is greater than the predetermined minimum gate time;
performing a second measurement with the counter-timer set to the new gate time; and
displaying the second measurement result on the display means.

12. A method for increasing the resolution of measurements taken using a counter-timer comprising the steps of:
selecting a magnifier value;
displaying the selected magnifier value on a display means;
performing a trial measurement with the counter-timer set at a predetermined gate time;
displaying the trial measurement result on the display means;
determining a new gate time based upon the selected magnifier value and the trial measurement result;
comparing the new gate time to a predetermined maximum gate time;
displaying an indication that the new gate time is greater than the predetermined maximum-gate time on the display means if the new gate time is greater than the predetermined maximum gate time;
performing a second measurement with the counter-timer set to the new gate time; and
displaying the second measurement result on the display means.

* * * * *